US009124346B2

(12) United States Patent
Skafidas et al.

(10) Patent No.: US 9,124,346 B2
(45) Date of Patent: Sep. 1, 2015

(54) SWITCHING GATES MIXER

(75) Inventors: Stan Skafidas, Eveleigh (AU); Fan Zhang, Eveleigh (AU)

(73) Assignee: Nitero Pty Limited, Melbourne (AU)

( * ) Notice: Subject to any disclaimer, the term of this patent is extended or adjusted under 35 U.S.C. 154(b) by 429 days.

(21) Appl. No.: 13/514,528

(22) PCT Filed: Dec. 9, 2010

(86) PCT No.: PCT/AU2010/001670
§ 371 (c)(1),
(2), (4) Date: Sep. 25, 2012

(87) PCT Pub. No.: WO2011/069209
PCT Pub. Date: Jun. 16, 2011

(65) Prior Publication Data

US 2013/0045696 A1 Feb. 21, 2013

(30) Foreign Application Priority Data

Dec. 11, 2009 (AU) ................................ 2009906059

(51) Int. Cl.
*H04B 1/38* (2015.01)
*H04B 1/30* (2006.01)
(Continued)

(52) U.S. Cl.
CPC ............... *H04B 1/30* (2013.01); *H03D 7/1441* (2013.01); *H03D 7/1458* (2013.01); *H03D 7/1475* (2013.01); *H03D 7/1483* (2013.01); *H03D 7/165* (2013.01); *H04B 1/0028* (2013.01)

(58) Field of Classification Search
USPC ......................... 455/73, 189.1, 209, 293, 326
See application file for complete search history.

(56) References Cited

U.S. PATENT DOCUMENTS 5,303,417 A 4/1994 Laws
6,348,830 B1 2/2002 Rebeiz et al.
(Continued)

FOREIGN PATENT DOCUMENTS

CN 101110568 1/2008
JP 2006217460 8/2006
(Continued)

OTHER PUBLICATIONS

International Search Report PCT/AU2010/001670, completion date Feb. 18, 2011, 5 pgs.
(Continued)

*Primary Examiner* — Ayodeji Ayotunde
(74) *Attorney, Agent, or Firm* — Hickman Palermo Becker Bingham LLP

(57) ABSTRACT

This invention concerns a sub-harmonic homodyne mixer suitable for operation at the millimeter waveband (MMW); for instance the 60 GHz RF radio band. The mixer comprises: A first pair of transistors connected together with common source and common drain, and having an input port across their gates to receive the in-phase voltage signal from a local oscillator. A second pair of transistors also connected together with common source and common drain, and having an input port across their gates to receive the quadrature voltage signal from the local oscillator. Wherein, an input voltage port is defined directly across the common sources of the first and second pairs of transistors, and an output voltage port is defined between the common drains of the first pair of transistors and the common drains of the second pair of transistors. According to another aspect the present invention is a transceiver comprising a mixer according to the first aspect.

2 Claims, 2 Drawing Sheets

(b)

(51) Int. Cl.

| | |
|---|---|
| ***H03D 7/14*** | (2006.01) |
| ***H03D 7/16*** | (2006.01) |
| ***H04B 1/00*** | (2006.01) |

(56) References Cited

U.S. PATENT DOCUMENTS

| | | | | |
|---|---|---|---|---|
| 7,248,850 | B2 | 7/2007 | Shen | |
| 8,121,577 | B1 * | 2/2012 | McKay | 455/326 |
| 2004/0104758 | A1 | 6/2004 | Romano | |
| 2004/0106391 | A1 | 6/2004 | Romano | |
| 2005/0170806 | A1 * | 8/2005 | Kim | 455/323 |
| 2006/0086997 | A1 * | 4/2006 | Kanaya et al. | 257/471 |
| 2008/0102777 | A1 | 5/2008 | Vice | |
| 2008/0132194 | A1 | 6/2008 | Ji et al. | |
| 2008/0169859 | A1 | 7/2008 | Garcia et al. | |
| 2009/0270062 | A1 * | 10/2009 | Mu et al. | 455/323 |

FOREIGN PATENT DOCUMENTS

| | | |
|---|---|---|
| JP | 2007235368 | 9/2007 |
| JP | 2007274040 | 10/2007 |
| KR | 20070041268 | 4/2007 |
| KR | 20080052301 | 6/2008 |
| WO | 03/007470 | 1/2003 |
| WO | 2004/019482 | 3/2004 |
| WO | 2008/136103 | 11/2008 |

OTHER PUBLICATIONS

Written Opinion PCT/AU2010/001670, completion date Feb. 18, 2011, 7 pgs.

Steven Rose, "A CMOS Sub-harmonic Mixer for WCDMA" http://rfic.eecs.berkeley, edu/files/scrose_thesis.pdf; 54 pages.

Jeng-Han Tsai, 35-65-GHz CMOS Broadband Modulator and Demodulator With Sub-Harmonic Pumping for MMW Wireless Gigabit Applications, IEEE transactions on microwave theory and techniques, 2007, vol. 55, No. 10, pp. 2075-2085.

Jeng-Han Tsai, A 30-100 GHz Wideband Sub-Harmonic Active Mixer in 90 nm CMOS Technology, Microwave and Wireless Components Letters, IEEE, Aug. 2008 vol. 18, No. 8 pp. 554-556.

IP Australia, "Patent Examination Report No. 1", in application No. 2010330697, dated May 6, 2014, 2 pages.

Current Claims in Australia application No. 2010330697, dated May 2014, 3 pages.

* cited by examiner

SWITCHING GATES MIXER

RELATED APPLICATIONS

This is a §371 application of PCT/AU2010/001670 filed Dec. 9, 2010, which claims priority from Australian Application No. 2009906059, filed Dec. 11, 2009.

TECHNICAL FIELD

This invention concerns a sub-harmonic homodyne mixer suitable for operation at the millimeter waveband (MMW); for instance the 60 GHz RF radio band. In a further aspect the invention is an RF transceiver incorporating the mixer.

BACKGROUND ART

Mixers are used in transceivers, such as mobile phones and Wi-Fi devices, to convert low frequency signals to high frequency signals, and high frequency signals to low frequency. Mixers essentially receive two signals at different frequencies and produce several outputs at different frequencies resulting from the mix. Filters are then used to select the output signal having the frequencies of interest.

In general, a mixer makes use of a locally generated artificial RF signal (from a local oscillator), to convert the received signal into the outputs.

In communications receivers and transmitters, a 'superheterodyne' mixer indicates the use of more than one mixing stage to step between the radio frequency (RF) signal that is transmitted and the baseband information signal. Superheterodyne architectures generally require off-chip components and are more expensive to implement than single chip solutions.

In contrast 'homodyne' refers to the direct conversion between RF and baseband (usually there are at least two quadrature baseband signals). Direct conversion avoids the use of intermediate stages and frequencies, and requires less filters and amplifiers. As a result homodyne circuits are generally more cost-effective to integrate.

There are however drawbacks to direct conversion. For instance, in a receiver where the local oscillators provide an artificial RF frequency at the same frequency as the received RF, then an unwanted DC offset can appear in the baseband output. To address this problem the local oscillators can be arranged to generate a signal at a given fraction of the RF frequency; as a result the artificial RF and received RF are different. Mixers that use this technique are termed 'sub-harmonic mixers'.

Another problem arises where there is noise in the output of the power amplifier. Where this noise is near to the frequency of the local oscillator it can 'pull' the local oscillator frequency to 'lock' onto the noise frequency. This corrupts the output but can also be alleviated by sub-harmonic mixing.

Referring now to FIG. 1(*a*), in a homodyne receiver 10 an antenna 12 receives a modulated RF signal. After reception this signal is passed through a filter 14 and an amplifier 16 before mixing with a locally generated signal at half the RF frequency at mixer 18. The output of mixer 18 passes through another filter and amplifier 20 to provide the analogue baseband signal. A digital baseband signal becomes available after processing in the analogue to digital converter (ADC) 22.

Referring next to FIG. 1(*b*), a transmitter 40 takes a digital baseband signal and passes it through a digital to analogue converter (DAC) 42 to generate an analogue baseband signal. The analogue signal is passed through an amplifier 44 and then mixed with a locally generated RF signal at mixer 46 to up-convert it. Further amplification 48 and filtering 50 results in the RF signal, modulated with the analogue baseband signal, being provided to transmitting antenna 52 for transmission.

The architecture of a conventional mixer, as used in FIG. 1, is shown in FIG. 2. Mixer 60 comprises a first pair of transistors 62 and 64 connected with common source and common drain. The in-phase signal from the local oscillator $LO_1$ is applied across the gates 66 and 68 of this pair of transistors. A second pair of transistors 70 and 72 are also connected with common source and common drain. The quadrature signal from the local oscillator $LO_Q$ is applied across the gates 74 and 76 of the second pair of transistors. All four sources are connected together 78. The input voltage is applied to the common source of all four transistors 78 via a further transistor 80 connected between the common source 78 and a matching network 90. The matching network is generally designed using L matching or inductive degeneration. The output $V_{out}$ is taken from between the common drain 82 of the first pair and the common drain 84 of the second pair of transistors. A matching network may also be provided at the gate of further transistor 80.

SUMMARY OF THE INVENTION

In a first aspect the invention is a sub-harmonic, homodyne, switching gates mixer for operation in the millimeter wave band (MMW), comprising:

- A first pair of transistors connected together with common source and common drain, and having an input port across their gates to receive the in-phase voltage signal from a local oscillator.
- A second pair of transistors also connected together with common source and common drain, and having an input port across their gates to receive the quadrature voltage signal from the local oscillator.
- Wherein, an input voltage port is defined directly across the common sources of the first and second pairs of transistors, and an output voltage port is defined between the common drains of the first pair of transistors and the common drains of the second pair of transistors.

As a result of applying the input directly to the common sources, the mixer performs as common gate amplifiers that are switched ON and OFF by the signals from the local oscillator. Such a mixer is capable of both high isolation between the input and output ports and wideband operation.

The invention may operate as a down-converting switching gates mixer, wherein a modulated radio frequency (RF) analogue voltage signal is applied at the input port, and an analogue baseband voltage signal appears at the output port.

Alternatively the invention may operate as an up-converting switching gates mixer, wherein an analogue baseband voltage signal is applied at the input port, and a modulated radio frequency output voltage signal appears at the output port.

Isolation between input and output may be further improved by utilizing sub-harmonic mixing. This technique may also alleviate injection pulling.

In any event the input impedance to the common gate amplifier stage is real, that is resistive rather than reactive. As a result the matching network will be low Q and is wideband. For instance the matching network may comprise one or more n-diffusion resistors between the common source (or input port) and ground.

Of course, the local oscillator may be divided into more than two quadrature components; for instance four-way quadrature division may be utilised. In this case the switching part of the circuit will involve double the number of pairs of transistors arranged in parallel; one pair for each division According to another aspect the present invention is a transceiver comprising a mixer according to the first aspect.

BRIEF DESCRIPTION OF THE DRAWINGS

The prior art has been described with reference to FIGS. 1 and 2 of the accompanying drawings, in which:

FIG. 1(*b*) is a block diagram that shows the use of a mixer as an up-converter in a transmitter.

Figure 1:
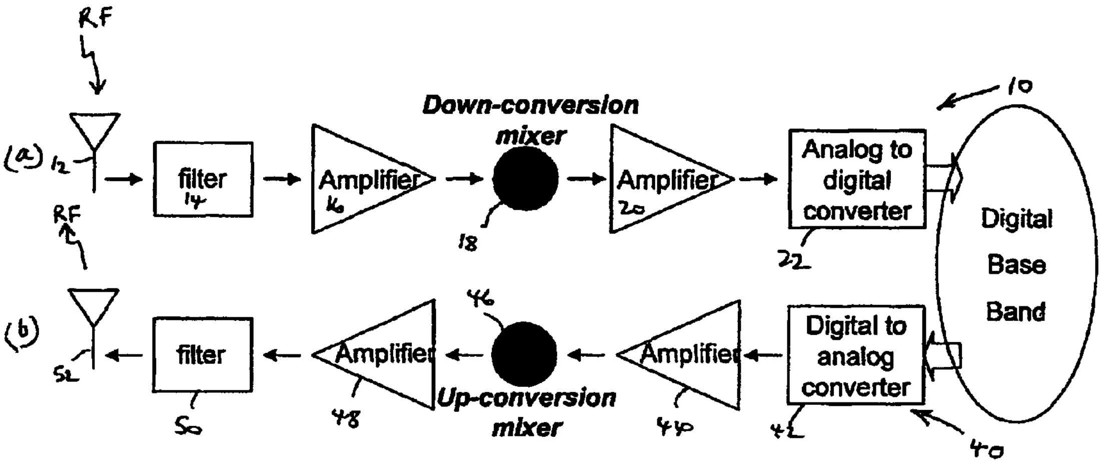
FIG. 1(*a*) is a block diagram that shows the use of a sub-harmonic mixer as a down converter in a homodyne receiver.
Figure 2:
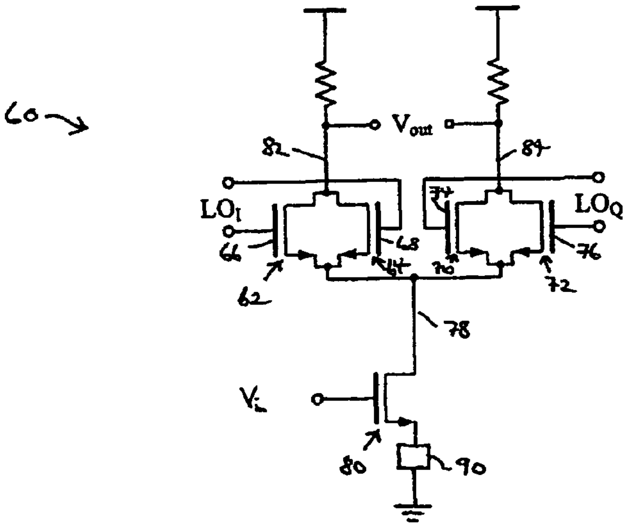
FIG. 2 is a circuit diagram of a conventional down-converting mixer circuit.
Figure 3:
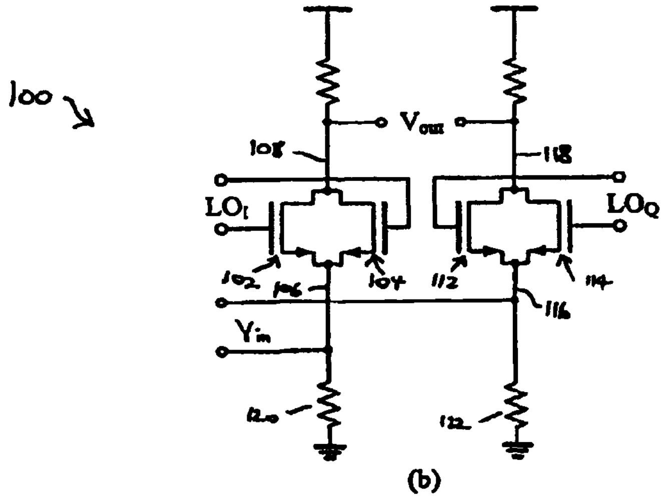

An example of the invention will now be described with reference to the following accompanying drawings, in which:

FIG. 3 is a circuit diagram of a switching gates mixer.

Figure 4:
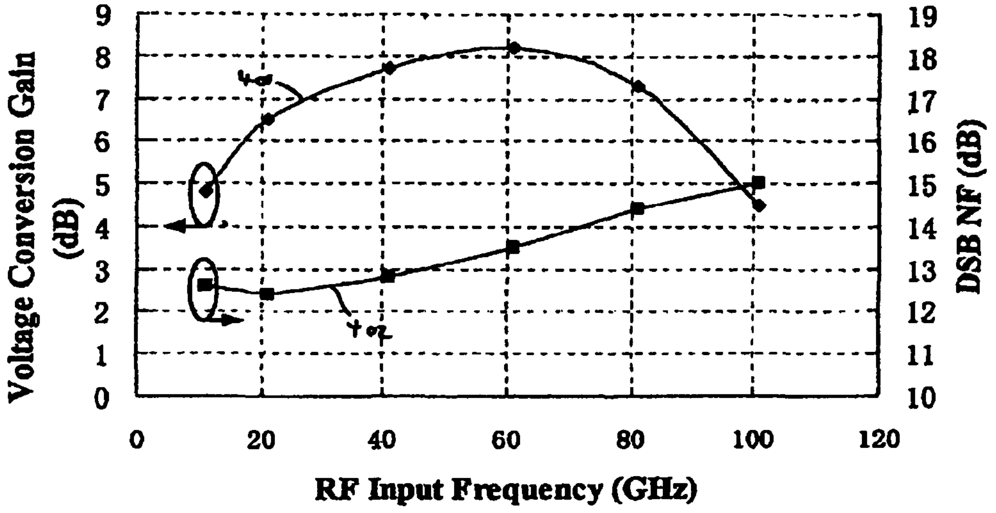

FIG. 4 is a graph of Voltage Conversion Gain (dB) and DSB NF (dB) plotted against RF Input Frequency (GHz) for the mixer of FIG. 3.

BEST MODE OF THE INVENTION

Referring now to FIG. 3. Mixer 100 comprises a first pair of transistors 102 and 104 connected with common source 106 and common drain 108. The in-phase signal from the local oscillator $LO_1$ is applied across the gates of transistors 102 and 104. A second pair of transistors 112 and 114 is also connected with common source 116 and common drain 118. The quadrature signal from the local oscillator $LO_Q$ is applied across the gates of transistors 112 and 116. The input voltage is directly applied differentially across common source 106 and common source 116. As a result the matching network is real, and in this example is a pair of n-diffusion resistors 120 and 122 connected between the common sources 106 and 116 and ground. In operation the mixer performs as common gate amplifiers that are switched ON and OFF by the signals from the local oscillator. The output $V_{out}$ is taken from between the common drain 108 of the first pair and the common drain 118 of the second pair of transistors.

The input may be a modulated radio frequency (RF) analogue voltage signal, in which case the mixer operates as a down-converter and delivers an analogue baseband voltage signal at the output port. FIG. 4 shows the voltage conversion gain 400 in dB from the 60 GHz band to baseband, and the double side band noise figure (DSB NF) 402 in dB. This graph shows wideband operation over the 20 GHz-100 GHz range, and a voltage conversion gain of more than 4 dB across the bandwidth.

Alternatively, the input may be an analogue baseband voltage signal, in which case the mixer operates as an up-converter and delivers a modulated radio frequency output voltage signal at the output port.

The good isolation between the Local Oscillator (LO) and the Radio Frequency (RF) parts of the mixer enables a homodyne application. The circuit is also integrated provide a homodyne mixer with compact chip size which cost effective when compared to a super-heterodyne structure. And, the wide bandwidth facilitates multi-band transceiver applications.

It will be appreciated by persons skilled in the art that numerous variations or modifications may be made to the examples of the invention described above without exceeding the scope of the invention as claimed. The present examples are, therefore, to be considered in all respects as illustrative and not restrictive.

For instance, isolation between input and output may be further improved by utilizing sub-harmonic mixing with local oscillator frequency at half the RF carrier frequency. This technique may also alleviate injection pulling.

Since the input impedance to the common gate amplifier stage is real, the matching network has low Q and is wideband and may be realised by one or more n-diffusion resistors between the common source (or input port) and ground. However, different matching networks could be used, where the n-diffusion resistors are configured and optimised for different frequency operation, or narrow band operation with higher conversion gain.

The invention claimed is:

1. A sub-harmonic, homodyne, switching gates mixer for operation in a millimeter wave band (MMW), comprising:

a first pair of transistors connected together with a common source and a common drain, and having an input port across their gates to receive an in-phase voltage signal from a local oscillator;

a second pair of transistors connected together with a common source and a common drain, and having an input port across their gates to receive a quadrature voltage signal from the local oscillator;

wherein an input voltage port is defined directly across the common source of the first pair of transistors and the common source of the second pair of transistors, and an output voltage port is defined between the common drain of the first pair of transistors and the common drain of the second pair of transistors.

2. A transceiver comprising a sub-harmonic, homodyne, switching gates mixer according to claim 1.

* * * * *

UNITED STATES PATENT AND TRADEMARK OFFICE
CERTIFICATE OF CORRECTION

PATENT NO. : 9,124,346 B2
APPLICATION NO. : 13/514528
DATED : September 1, 2015
INVENTOR(S) : Stan Skafidas et al.

It is certified that error appears in the above-identified patent and that said Letters Patent is hereby corrected as shown below:

Delete the title page and replace with the attached title page showing the corrected number of claims.

In the claims
COLUMN 4

Lines 48-49 - Please delete: "2. A transceiver comprising a sub-harmonic, homodyne, switching gates mixer according to claim 1."

Line 50: Please insert

--2. A sub-harmonic, homodyne, switching gates mixer according to claim 1, operating as a down-converting switching gates mixer, wherein a modulated radio frequency (RF) analogue voltage signal is applied at the input voltage port, and an analogue baseband voltage signal appears at the output voltage port.

3. A sub-harmonic, homodyne, switching gates mixer according to claim 1, operating as an up-converting switching gates mixer, wherein an analogue baseband voltage signal is applied at the input voltage port, and a modulated radio frequency output voltage signal appears at the output voltage port.

4. A sub-harmonic, homodyne, switching gates mixer according to claim 1, wherein isolation between input and output is further improved by utilizing sub-harmonic mixing.

5. A sub-harmonic, homodyne, switching gates mixer according to claim 1, wherein an input impedance to a common gate amplifier stage is resistive, and a matching network is low Q and wideband.

6. A sub-harmonic, homodyne, switching gates mixer according to claim 5, wherein the matching network comprises a first n-diffusion resistor and a second n-diffusion resistor, the first n-diffusion resistor connected between the common source of the first pair of transistors and ground, the second n-diffusion resistor connected between the common source of the second pair of transistors and ground.
In the claims Signed and Sealed this
Nineteenth Day of April, 2016

*Michelle K. Lee*

Michelle K. Lee
*Director of the United States Patent and Trademark Office*

COLUMN 4

Line 50: [continued from page 1]:

7. A sub-harmonic, homodyne, switching gates mixer according to claim 1, wherein the local oscillator is divided into more than two quadrature components.

8. A transceiver comprising a sub-harmonic, homodyne, switching gates mixer according to claim 1.--

(12) United States Patent
Skafidas et al.

(10) Patent No.: US 9,124,346 B2
(45) Date of Patent: Sep. 1, 2015

(54) SWITCHING GATES MIXER

(75) Inventors: Stan Skafidas, Eveleigh (AU); Fan Zhang, Eveleigh (AU)

(73) Assignee: Nitero Pty Limited, Melbourne (AU)

(*) Notice: Subject to any disclaimer, the term of this patent is extended or adjusted under 35 U.S.C. 154(b) by 429 days.

(21) Appl. No.: 13/514,528

(22) PCT Filed: Dec. 9, 2010

(86) PCT No.: PCT/AU2010/001670

§ 371 (c)(1),
(2), (4) Date: Sep. 25, 2012

(87) PCT Pub. No.: WO2011/069209

PCT Pub. Date: Jun. 16, 2011

(65) Prior Publication Data

US 2013/0045696 A1 Feb. 21, 2013

(30) Foreign Application Priority Data

Dec. 11, 2009 (AU) .............................. 2009906059

(51) Int. Cl.
*H04B 1/38* (2015.01)
*H04B 1/30* (2006.01)
(Continued)

(52) U.S. Cl.
CPC ............... *H04B 1/30* (2013.01); *H03D 7/1441* (2013.01); *H03D 7/1458* (2013.01); *H03D 7/1475* (2013.01); *H03D 7/1483* (2013.01); *H03D 7/165* (2013.01); *H04B 1/0028* (2013.01)

(58) Field of Classification Search
USPC ........................ 455/73, 189.1, 209, 293, 326
See application file for complete search history.

(56) References Cited

U.S. PATENT DOCUMENTS 5,303,417 A 4/1994 Laws
6,348,830 B1 2/2002 Rebeiz et al.

(Continued)

FOREIGN PATENT DOCUMENTS

CN 101110568 1/2008
JP 2006217460 8/2006

(Continued)

OTHER PUBLICATIONS

International Search Report PCT/AU2010/001670, completion date Feb. 18, 2011, 5 pgs.

(Continued)

*Primary Examiner* — Ayodeji Ayotunde
(74) *Attorney, Agent, or Firm* — Hickman Palermo Becker Bingham LLP

(57) ABSTRACT

This invention concerns a sub-harmonic homodyne mixer suitable for operation at the millimeter waveband (MMW); for instance the 60 GHz RF radio band. The mixer comprises: A first pair of transistors connected together with common source and common drain, and having an input port across their gates to receive the in-phase voltage signal from a local oscillator. A second pair of transistors also connected together with common source and common drain, and having an input port across their gates to receive the quadrature voltage signal from the local oscillator. Wherein, an input voltage port is defined directly across the common sources of the first and second pairs of transistors, and an output voltage port is defined between the common drains of the first pair of transistors and the common drains of the second pair of transistors. According to another aspect the present invention is a transceiver comprising a mixer according to the first aspect.

8 Claims, 2 Drawing Sheets

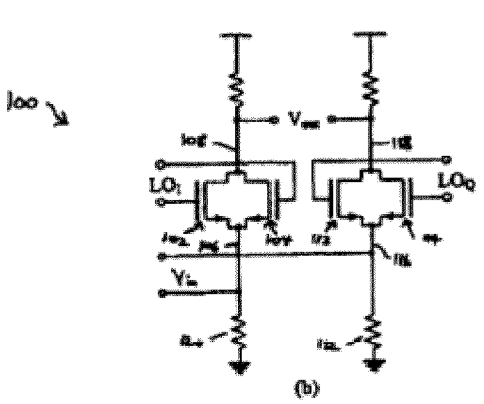

(b)